United States Patent [19]

Eden et al.

[11] Patent Number: 4,575,821

[45] Date of Patent: Mar. 11, 1986

[54] LOW POWER, HIGH SPEED RANDOM ACCESS MEMORY CIRCUIT

[75] Inventors: Richard C. Eden; George R. Kaelin, both of Thousand Oaks, Calif.

[73] Assignee: Rockwell International Corporation, El Segundo, Calif.

[21] Appl. No.: 493,093

[22] Filed: May 9, 1983 (Under 37 CFR 1.47)

[51] Int. Cl.[4] .................... G11C 7/00; G11C 11/34
[52] U.S. Cl. .................................. 365/154; 365/190; 365/175
[58] Field of Search ............... 365/154, 156, 189, 190, 365/175, 177, 180

[56] References Cited

U.S. PATENT DOCUMENTS

| | | | |
|---|---|---|---|
| 3,603,820 | 9/1971 | Schuenemann | 365/180 |
| 3,686,645 | 8/1972 | Brojdo | 365/154 |
| 3,849,675 | 11/1974 | Waaben | 365/154 |
| 3,863,229 | 1/1975 | Gersbach | 365/180 |
| 3,990,056 | 11/1976 | Luisi et al. | 365/154 |
| 4,091,461 | 5/1978 | Booher | 365/154 |
| 4,096,584 | 6/1978 | Owen, III et al. | 365/227 |
| 4,110,840 | 8/1978 | Abe et al. | 365/203 |
| 4,122,540 | 10/1978 | Russell et al. | 365/104 |
| 4,123,799 | 10/1978 | Peterson | 365/205 |
| 4,133,611 | 1/1979 | Baker | 365/154 |
| 4,233,674 | 11/1980 | Russel et al. | 365/200 |
| 4,287,575 | 9/1981 | Eardley et al. | 365/174 |
| 4,300,064 | 11/1981 | Eden | 307/446 |
| 4,322,824 | 3/1982 | Allan | 365/185 |
| 4,355,377 | 10/1982 | Sud et al. | 365/203 |

OTHER PUBLICATIONS

Kaelin et al, "An Ultra Low Power, Fast GaAs RAM for Space Applications", First Annual Phoenix Conference on Computers and Communications, May 9-12, 1982, pp. 414-416.

Primary Examiner—Stuart N. Hecker
Assistant Examiner—Glenn A. Gossage
Attorney, Agent, or Firm—H. Fredrick Hamann; Craig O. Malin; John J. Deinken

[57] ABSTRACT

A random access memory circuit for use with positive and negative supply voltages, a read enable line, an output line, and write "1" and "0" lines includes first, second, third, and fourth level shifting diodes. A first input isolation diode is connected between the write "1" line and the first level shifting diode. A second input isolation diode is connected between the write "0" line and the cathode of the third level shifting diode. The drain of a first write FET is connected to the anode of the third diode, the source is connected to the read enable line, and the gate is connected to the cathode of the second level shifting diode. A second write FET has its drain connected to the anode of the first level shifting diode, its source connected to the read enable line, and its gate connected to the cathode of the fourth diode. An output buffer FET is connected by its source to the read enable line, by its gate to the cathode of the fourth diode. An output isolation diode is connected between the drain of the output buffer FET and the output line.

16 Claims, 10 Drawing Figures

LOW POWER, HIGH SPEED RANDOM ACCESS MEMORY CIRCUIT

GOVERNMENT RIGHTS

The U.S. Government has rights in this invention pursuant to a contract awarded by the Defense Supply Service.

BACKGROUND OF THE INVENTION

This invention relates to random access memory circuits, particularly such circuits adapted for high speed operation and low power dissipation.

In recent years, increasing interest has developed in the use of GaAs materials for high speed digital integrated circuits. Rapid progress in developing this technology has been stimulated by the availability of existing equipment and sophisticated processing techniques which were developed for silicon based semiconductor technologies.

The switch to GaAs devices has been prompted by the need for a semiconductor with higher performance than silicon as high speed semiconductor technologies approach the physical limits of their performance, which is determined by the minimum dimensions which are attainable.

Any digital integrated circuit technology, however, must be accompanied by compatible memory circuits to be useful in practical applications. Space based satellites, for example, are widely used in communications systems, and it is anticipated that in the future numerous defense, surveillance, and intelligence missions will require space-based radar, communications, and electro-optical systems. This equipment will require high speed signal processing to be accomplished on board the space vehicle prior to data transmission. This processing capability will, in turn, require large quantities of random access memory (RAM).

One of the most critical design constraints imposed on such memory circuits by space applications is the need for a low power dissipation, typically approximately 1 microwatt (uW) per bit of memory. In addition, this power limitation must be satisfied while maintaining a sufficiently fast access time, typically less than 10 nanoseconds (ns). Another important design constraint is radiation hardening, with radiation resistance required against total doses in excess of one million rads. The radiation resistance of GaAs integrated circuits, combined with their high speed and low power capabilities, makes this technology ideal for a RAM which is to be used in such applications.

The rate of access of RAM in a signal processing application is very low because of the large memory size. Thus it is the static power used by each bit cell in the RAM which will predominate in the overall power consumption of the memory, provided the chip peripherals, such as address decoders, bit sense amplifiers, etc., are powered down when a particular chip is not accessed for a read or write. The static power Pd consumed by a RAM cell is given by:

$$Pd = VddIdd$$

where Vdd is the supply voltage and Idd is the static supply current. The design challenge, therefore, is to reduce Idd for the RAM cells, consistent with proper cell functioning and allowing for statistical variations in the parameters.

In the case of a GaAs static RAM, the key design problem is not so much the attainment of a fast access time, but obtaining such high speed operation while simultaneously holding the power dissipation levels low. If, for example, a 4096 bit (4K) memory is arranged in a $64 \times 64$ bit array, the total bit sense line capacitance on one of the 64 cell columns will be approximately 425 pF, including overcrossings, stray line capacitances, and the diode input capacitance at each cell. Using the smallest practical GaAs field effect transistor (FET) as the active load in the cell, with a width of 1 $\mu$m and a threshold voltage of $Vp = -0.7$ V, the current will be 20 uA. This current would discharge the bit line by 0.75 V in 15 ns. For an access time Tacc of 10 ns, the maximum discharge time will be approximately 4 ns and such a memory cell must sink a current of 0.82 mA to achieve this. With 4K cells operating at 0.82 mA quiescent current levels and $Vdd = 3$ V, the total chip power dissipation would be an unacceptably high 10 W. Consequently, a need has arisen in the random access memory art for a RAM circuit which will achieve a fast access time without affecting the power dissipation of unaddressed cells.

SUMMARY OF THE INVENTION

It is a general objective of this invention to provide a new and improved random access memory circuit. In one embodiment, this circuit is intended for use in conjunction with a positive supply voltage, a negative supply voltage, a read enable line, an output line, a write "1" line, and a write "0" line. The circuit includes first, second, third, and fourth level shifting diodes, the anodes of the first and third diodes being connected to the positive supply voltage while the cathodes of the second and fourth diodes are connected to the negative supply voltage. The cathodes of the first and third diodes are connected to the anodes of the second and fourth diodes, respectively. A first input isolation diode has its anode connected to the write "1" line and its cathode connected to the cathode of the first diode, while a second input isolation diode is connected by its anode to the write "0" line and by its cathode to the cathode of the third diode.

The drain of a "1" FET is connected to the anode of the third diode, with the source connected to the read enable line and the gate connected to the cathode of the second diode. A "0" FET is connected by its drain to the anode of the first diode, by its source to the read enable line, and by its gate to the cathode of the fourth diode. An output buffer FET has its source connected to the read enable line and its gate connected to the cathode of the fourth diode. Finally, an output isolation diode is connected by its cathode to the drain of the output buffer FET and by its anode to the output line.

In a more particular embodiment, the circuit may also include a first pullup resistor between the positive supply voltage and the drain of the "1" FET, and a second pullup resistor between the positive supply voltage and the drain of the "0" FET. In addition, first and second pulldown resistors may be provided between the negative supply voltage and the cathodes of the second and fourth diodes, respectively. Moreover, a first capacitive diode may be added with its cathode connected to the anode of the first level shifting diode and its anode connected to the cathode of the second level shifting diode, while a second capacitive diode has its cathode connected to the anode of the third diode and its anode connected to the cathode of the fourth diode.

This circuit may be fabricated on a semi-insulating GaAs substrate, and may further be implemented with depletion mode metal semiconductor field effect transistors as the FETs and Schottky barrier diodes.

In another embodiment, the invention is in the form of an m×n random access memory circuit array with each cell or element of the array taking one of the forms described above and with m read enable lines and n output, write "1", and write "0" lines.

DESCRIPTION OF THE DRAWINGS

Additional details of the invention are presented below in the section entitled Description of the Invention, which refers to the drawings, where.

DESCRIPTION OF THE INVENTION

This invention was developed to utilize the performance advantages offered by GaAs integrated circuits in radiation hardness, low power dissipation, and high speed for a random access memory (RAM). A central feature of this design is a power concentration approach, in which an individual memory cell is maintained in a low power standby mode until it is accessed. Accessing the cell causes sufficient power to be concentrated on the cell for it to meet access time requirements.

Figure 1:
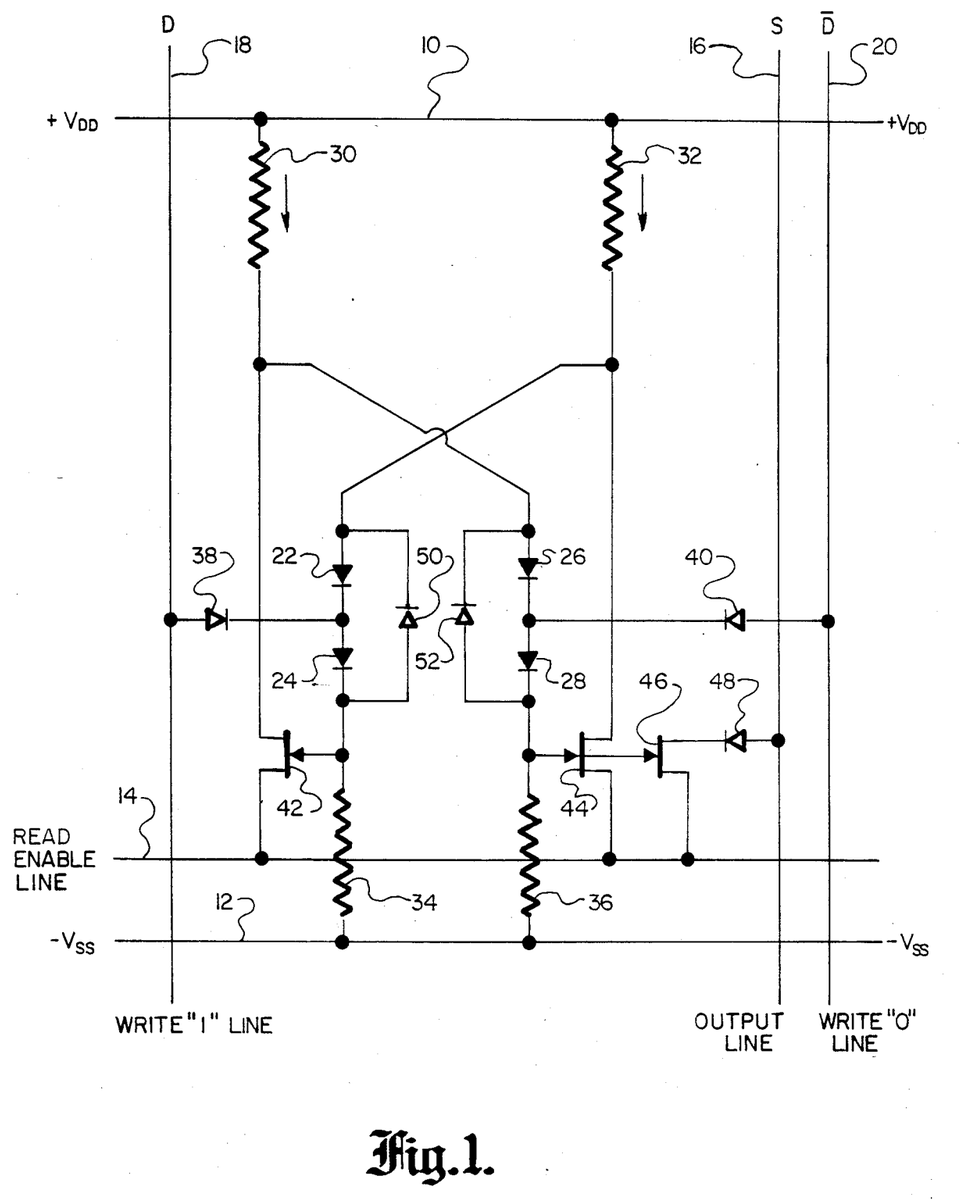
FIG. 1 is an electrical schematic diagram illustrating one embodiment of a random access memory circuit constructed in accordance with the present invention.

FIG. 1 is an electrical schematic diagram illustrating a preferred embodiment of a random access memory circuit constructed in accordance with the present invention. This circuit is designed to be operated in conjunction with a positive supply voltage line 10, a negative supply voltage line 12, a read enable line 14, an output line 16, a write "1" line 18, and a write "0" line 20.

The circuit includes a first level shifting diode 22; a second level shifting diode 24, the anode of which is connected to the cathode of the first diode; a third level shifting diode 26; and a fourth level shifting diode 28, the anode of which is connected to the cathode of the third diode. A first pullup resistor 30 is connected between the positive supply voltage line 10 and the anode of the third diode 26, while a second pullup resistor 32 is connected between the positive supply voltage line and the anode of the first diode 22.

A first pulldown resistor 34 is connected between the negative supply voltage line 12 and the cathode of the second diode 24, while a second pulldown resistor 36 is connected between the negative supply voltage line and the cathode of the fourth diode 28. Those skilled in the art will appreciate that the functions of the pullup and pulldown resistors 30-36 could also be accomplished by active devices, such a FETs. A first input isolation diode 38 has its anode connected to the write "1" line 18 and its cathode connected to the cathode of the first level shifting diode 22. A second input isolation diode 40 is connected by its anode to the write "0" line 20 and through its cathode to the cathode of the third level shifting diode 26.

A write "1" FET 42 is connected by its drain to the anode of the third diode 26, by its source to the read enable line 14, and by its gate to the cathode of the second diode 24. A write "0" FET 44 is connected to the anode of the first diode 22 by its drain, to the read enable line by its source, and to the cathode of the fourth diode 28 by its gate.

An output buffer FET 46 is provided, with its source connected to the read enable line 14 and its gate connected to the cathode of the fourth diode 28. An output isolation diode 48 is positioned with its cathode connected to the drain of the output buffer transistor 46 and its anode connected to the output line 16.

First and second capacitive diodes 50 and 52 provide capacitance across the diode pairs, with the cathode of the diode 50 connected to the anode of the first diode 22 and the anode of the diode 50 connected to the cathode of the second diode 24. The cathode of the diode 52 is connected to the anode of the third diode 26, while the anode of the diode 52 is connected to the cathode of the fourth diode 28.

Memory circuits conforming to this invention have been fabricated in GaAs with a planar technique which employs two different implants in order to optimize the doping profiles for both low capacitance (deep implant) diodes (such as the output isolation diode 48) and low threshold voltage (shallow implant) MESFETS (metal semiconductor field effect transistors). The material processes in this procedure are characterized by multiple, localized implant, non-epitaxial methods providing planar device structures which are automatically isolated due to the use of high quality semi-insulating GaAs substrates. Further details regarding this planar process are contained in Welch, et al., IEEE Trans. Elect. Dev., Vol. ED-27, Page 1116 (1980), the teaching of which is incorporated herein by reference. To this process is added a CERMET layer for fabricating resistors with sheet resistivities of approximately ten megohms per square. Patterning of the CERMET is accomplished by ion milling in the same way as for the second metal layer.

With the power concentration approach utilized by this invention, a memory cell is kept in a low power, standby mode until it is accessed; accessing it concentrates sufficient power on the cell for it to discharge the bit sense output line and meet access time requirements. An array of such cells thus operate at a minimum power level, and, in addition, only those peripheral circuit elements that are needed for a given operation are powered up. This is achieved by making the RAM cell itself capable of operating at much higher current levels in readout than its static operating current level and then using the column address demultiplexer to make available high current levels to the cell during bit readout in that column.

As shown in FIG. 1, the bit sense output line 16 is not connected directly to the latching circuit, but is connected through the output isolation diode 48 to the drain of the output buffer FET 46, the source and gate of which are in parallel with the write "0" FET 44 on one side of the latching circuit. The FET 44 will be "on" only when a "0" is stored in the latch. Ordinarily, however, this FET draws no current since either the column is not being accessed (so that no current is supplied to the output line 16 by the column demultiplexer), or, if the column is being accessed, but not this particular row, a sufficient voltage on the read enable line 14 at the source of unselected rows will prevent the diode 48 from conducting. If both the column and row are selected, however, then the read enable line voltage at the source of the FET 46 will drop and the voltage on the output line 16 will be determined by whether the FET 46 is "on".

The RAM cell, which is basically a flip-flop circuit, will operate so long as the two forward biased diodes provide an offset voltage equal to the pinchoff voltage of the FET. Voltages in the circuit are established by current levels; the current levels, of course, determine power. Reducing power means reducing the current by increasing the resistance values.

To achieve the submicrowatt mode of operation desired, however, takes these devices (diodes and FETs) into current regimes in which their operation has not been well characterized or understood. The two most critical device characteristics for this cell design were the FET operating characteristics below pinch-off (the subthreshold region) and the forward voltage drop of diodes carrying very low currents. To achieve the approximately 1 uW power level in a cell, operating currents must be in the tens of nanoamperes range, requiring that subthreshold currents and leakage currents be below this level. The voltage drop of a diode depends on current density, which can be kept high for a given current by making the diodes smaller. Practical photolithography, however, limits the diode to dimensions of 1 um by 1 um. Even at this size, the operating current density is four orders of magnitude less than the operating current density in diodes contained in more conventional Schottky diode FET logic (SDFL) circuits. For examples of other SDFL circuits, see Eden, U.S. Pat. No. 4,300,064, the teaching of which is incorporated herein by reference.

The particular embodiment of the invention which is shown in FIG. 1 was employed in fabricating a 4K RAM array on a semi-insulating GaAs substrate with depletion mode MESFETs and Schottky barrier diodes. In this design, the positive supply voltage Vdd is +5 V and the negative supply voltage Vss is −3 V. The read enable line 14 is at 0.0 V when enabled and at +1.5 V when disabled. The pullup resistors 30 and 32 are 59 megohm resistors, while the pulldown resistors 34 and 36 are 105 megohm resistors. The FETs 42 and 44 are 2 um wide, while the FET 46 is 15 um wide.

Diodes are used in GaAs circuits for voltage level shifting. For appreciable current densities, the forward voltage drop across a diode is normally approximately 0.7 V. In the lower current range compatible with the RAM circuit presented here, however, the voltage drop is much lower, ranging between 0.45 V and 0.52 V. The FETs in this RAM cell are operated in the subthreshold conduction region, in which the operating characteristics depart from the square law. To decrease the current by one decade requires a change in voltage of approximately 150 mV. If low current turnoff is defined as a one order of magnitude decrease in current, it can be taken as a voltage magnitude 0.15 V greater than the nominal pinch-off voltage.

With the negative supply voltage Vss near 0 V, both latch FETs 42 and 44 and the output FET 46 are on, the voltages at the drains of the latch FETs are 0 V, and the output voltage at the output line 16 is one diode drop above ground (i.e., approximately 0.6 V). As Vss is increased negatively, the gates of the transistors become negatively biased, current flow is limited, and the output voltage rises, the situation becoming that of a balanced amplifier. Further increases in Vss bring the gate voltage to V(pinch-off), at which point the circuit becomes bistable; the output will be high or low depending on the state of the latch circuit. The magnitude of Vss can then be increased over a considerable range with bistable operation preserved. Eventually Vss will become so negative that the "on" FET has its current reduced to where it will not clamp the drain voltage to 0 V, and this voltage starts to rise. Near this point, the circuit loses its bistability as the voltage on the drain of the "on" FET rises and no longer holds the gate of the "off" FET below pinch-off. This determines the margin of operation for Vss with a given positive supply voltage Vdd and with the read enable voltage at 0 V. The margin will be higher for higher values of Vdd.

The disabling characteristic of the cell can be determined by setting the read enable voltage at various values. As this voltage approaches the full disabling voltage of 1.5 V, the distinction apparent in the output between a "1" and a "0" disappears, and the range of Vss for bistability decreases.

The predominant effect of a 0.5 V change in Vdd is to produce an approximate 1.0 V widening of the operating region for a stored "0" with respect to Vss. Thus the cell is not particularly sensitive to Vdd variations.

Dynamic testing of the cell has shown that as the read enable voltage is increased, the point is reached where a write pulse on the appropriate line (line 16 or line 18) does not change the state of the cell; the cell is then disabled, which occurs at a read enable voltage of 1.3 V. As the read enable voltage reaches 1.5 V, the output is essentially the same for a stored "0" or "1". When the read enable voltage is again lowered, however, the voltage is appropriate to the stored state. If the read enable voltage is raised high enough, then subsequently lowered, the output voltage will always be that for a "1", regardless of the original state; the cell will be "forgetting" data.

One important parameter influencing memory cycle times is the minimum pulse width that can write, or change the state of, a cell. In dynamic testing, cell wrote "1" or "0" reliably and consistently with 2 ns pulses. The cell design is therefore more than fast enough for a 10 ns access time RAM.

Minimizing static power in the RAM cell is crucial to minimizing overall memory power. But the power in the peripheral decoder and driver circuits is also extremely important. These circuits operate in two modes: standby (low power) when idle, or enabled (at high power) when accessed. The peripheral circuit design was carried out based on a design goal of 10 ns access times, while keeping power as low as possible. Since the anticipated usage for this RAM leaves it in standby operation the majority of the time, the circuits were configured to reduce power in the standby mode to an absolute minimum.

The peripheral circuits for the 4K RAM design presented here were implemented with circuitry which is only slightly modified from the standard Schottky diode FET logic (see, e.g., U.S. Pat. No. 4,300,064). The RAM cell will require FET threshold voltages of approximately 0.5 V. This threshold is established by selecting the appropriate energy and fluence for the channel implant.

The access time of the RAM comprises the settling times of the decoder/driver circuitry, as well as the time for discharge of the bit sense output line by the RAM cell. The output line discharge time can be calculated, and used as a starting point for access time estimates. A timing budget can be set up for the decoder/driver circuits, and used as a design guide or specification for each of the circuits.

Figure 2:
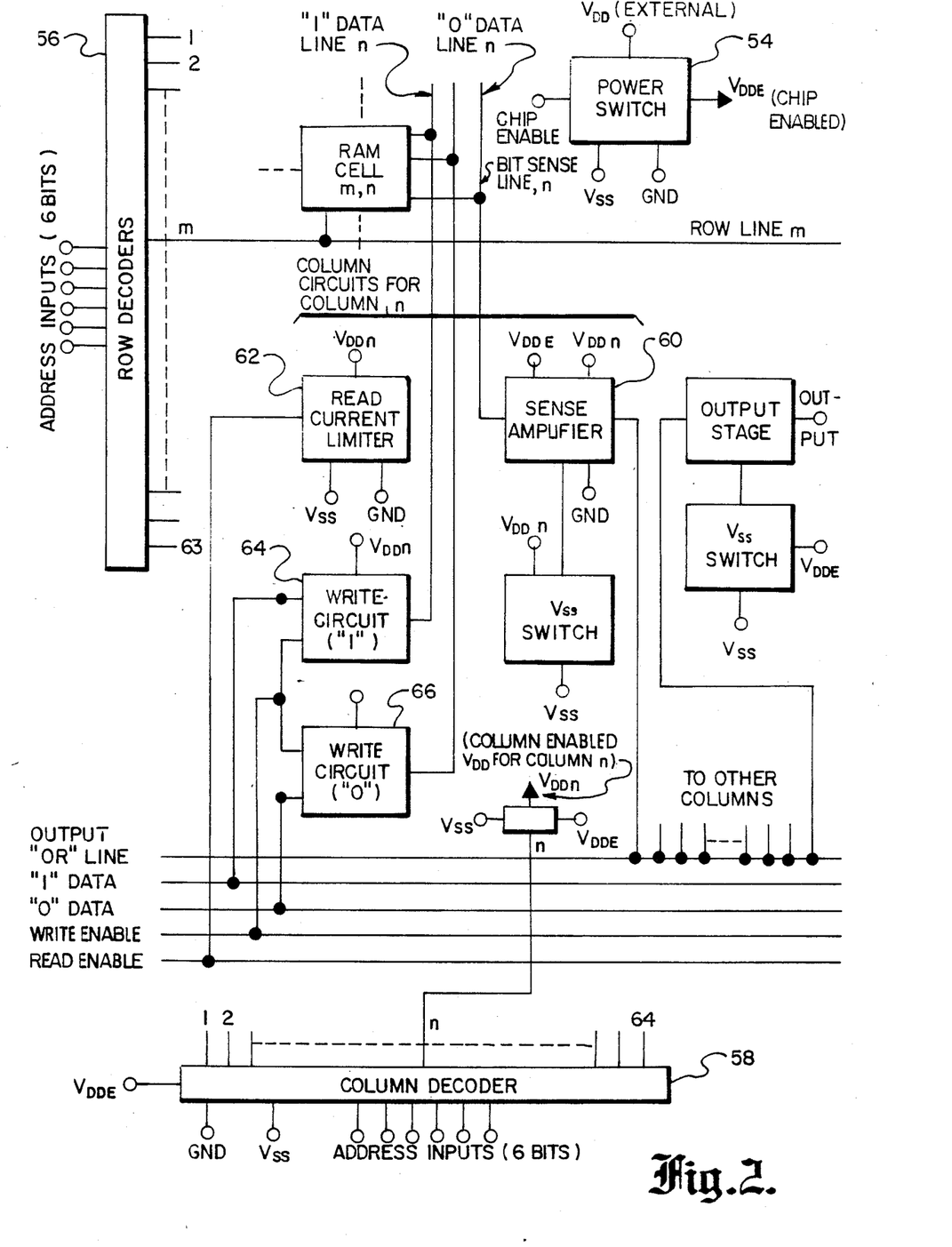
FIG. 2 is a block diagram schematic of the peripheral circuits for an m×n RAM array with individual cells like that shown in FIG. 1.

FIG. 2 is a block diagram schematic of the peripheral circuits for the RAM cell array which was constructed according to the present invention. As shown in FIG. 2, power is applied in two steps. When the chip is enabled, a power switch 54 applies power (through Vdde) to the row decoder circuits 56 and the column decoder circuits 58, but the column sense amplifiers 60 remain off and the rows are disabled with the output transistors drawing no power. The column sense amplifiers and the output transistors are turned on only for a particular column and a particular row when addressed.

The chip enable signal will turn on the power to the decoder/driver circuits. Memory addresses will always be available a full cycle time ahead of the associated access. Therefore, the design for a 10 ns access time is based on the assumption that the chip will have been previously enabled for a time sufficient that the power to the decoder circuits has become stable. Timing would start from the instant the address bits are stable.

It is assumed in this approach that the disabling of the chip will involve switching only the positive power supply. While it is practical to switch the negative supply of individual circuits, it is not practical to switch the negative supply to all the circuits with n channel MESFET technology. To overcome this limitation, a design approach is used in which the positive Vdd supply is switched and the circuits are designed so that when Vdd is switched to nearly 0 V, the current drawn by the negative (Vss) supply is kept to a minimum.

Figure 3:
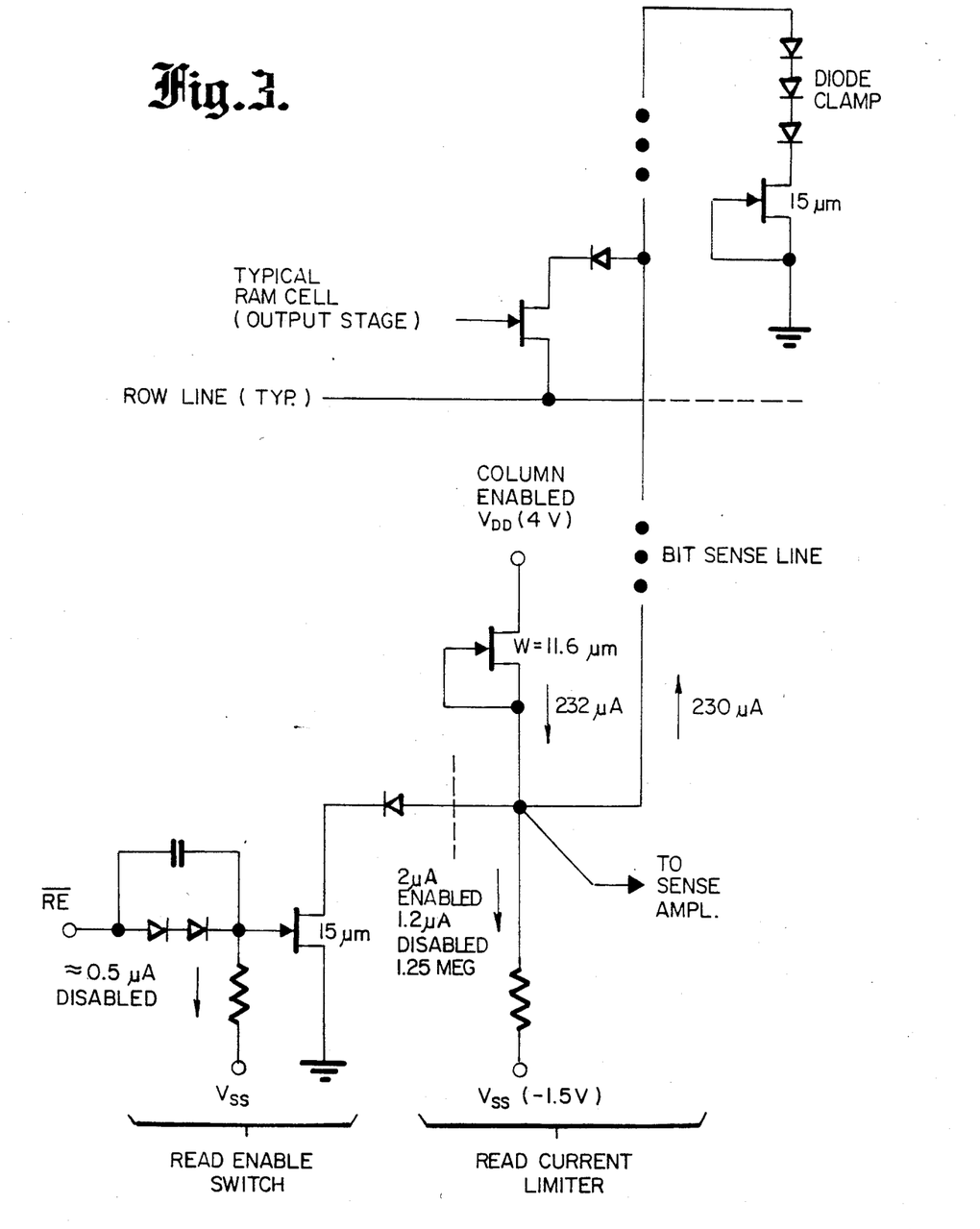
FIG. 3 is a schematic of the read current limiter of FIG. 2.

The most important element of the access time, and the logical starting point in a design, is the charging or discharging of the bit sense output line capacitance. The charging circuit for the bit sense line is the read current limiter 62, shown in more detail in the schematic of FIG. 3. A diode clamp is used to control the maximum voltage to which the bit sense output line rises. A series diode in the read enable switch keeps the line voltage above one diode drop, minimizing the voltage transition (and thus charging time). A resistive pull down is used, with a very small current (approximately 2 uA) to keep power dissipation low, especially in the powered-down (chip disabled) mode. There is a read current-limiter circuit and the associated diode clamp and read enable switch for each column, with only the circuits for the selected column being powered up. For the others, the column enabled Vdd is less than 0.5 V and the power dissipation for an unselected read current limiter is less than 3 uW.

The charging current must be carried (for a "0" bit) by the output FET 46 of the RAM cell. A size of 15 um for this FET will maintain an "output low" voltage of 1 V, which gives an output voltage swing larger than 1 V, allowing the 2 um FETs in the cell to switch the output FET in a few ns.

Figure 4:
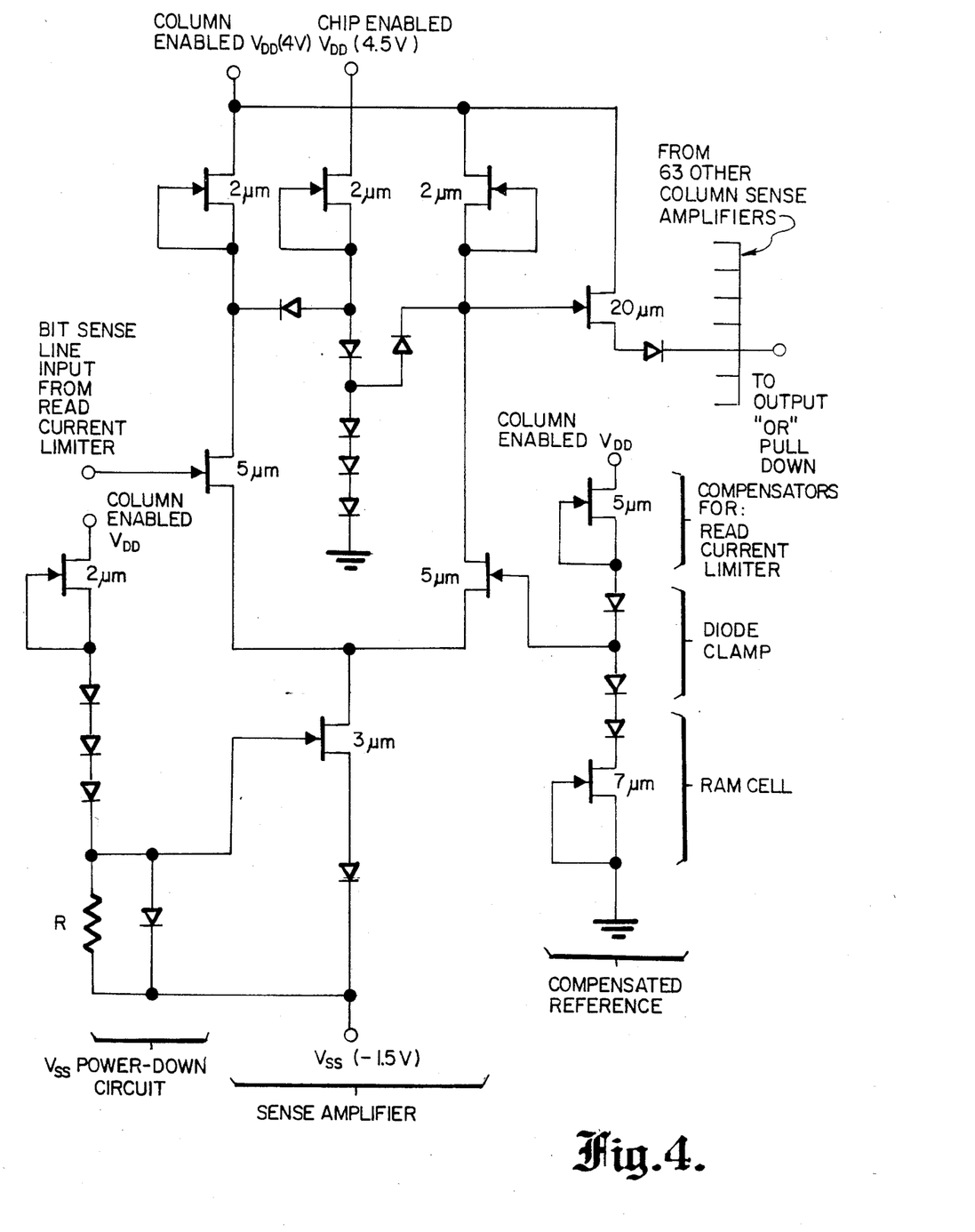
FIG. 4 is a schematic of the sense amplifier of FIG. 2.

The sense amplifier 60 is shown in more detail in the schematic of FIG. 4. This design is selected for reasonably high sensitivity with low power, and uses a compensating reference and switched negative power supply. The basic amplifier is a difference amplifier with current source and active loads in the drains of the amplifier FETs. A diode/FET network clamps the outputs of the amplifier FETs so that they never have forward gate-drain bias (this is necessary to retain high input impedance). The compensated reference includes devices which are scaled versions of, and thus emulate, a RAM cell output stage, the diode clamp, and the charging current limiter. By using the same kind of device to generate the reference as is used in the circuit, the reference provides a one diode drop threshold for either low or high output. A constant RAM array output voltage swing equal to two diode drops is thus assured, and the reference voltage is set precisely in the middle of the voltage swing. Because of this, sense amplifier sensitivity and accuracy are not critical.

For the sense amplifier, the negative Vss power supply is switched by a Vss power-down circuit. When the column is selected by turning on the "column enabled Vss", the Vss power down circuit provides a voltage equal to one diode drop at the gate of the amplifier's current source. When the column is not selected, the column enable Vdd is approximately 0 and three of the diodes have the magnitude of Vss, or approximately 1.5 V, across them; their impedance under these conditions is very high.

Figure 5:
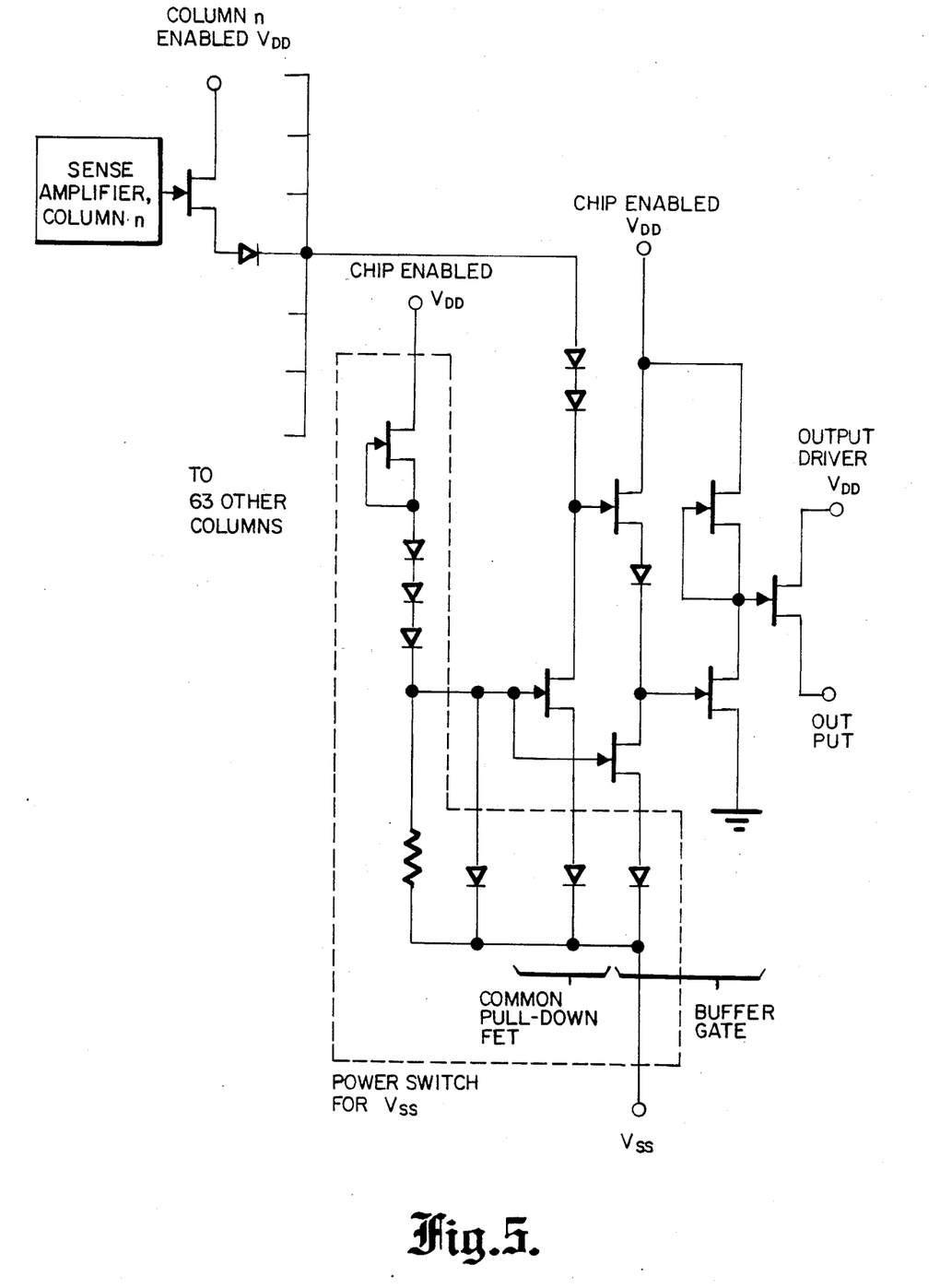
FIG. 5 is a schematic of a source follower output circuit for the array of FIG. 2.

The output from the sense amplifier 60 drives a source follower output circuit, shown in schematic form in FIG. 5. The output line is "source follower OR'd", using a common pull-down FET.

Figure 6:
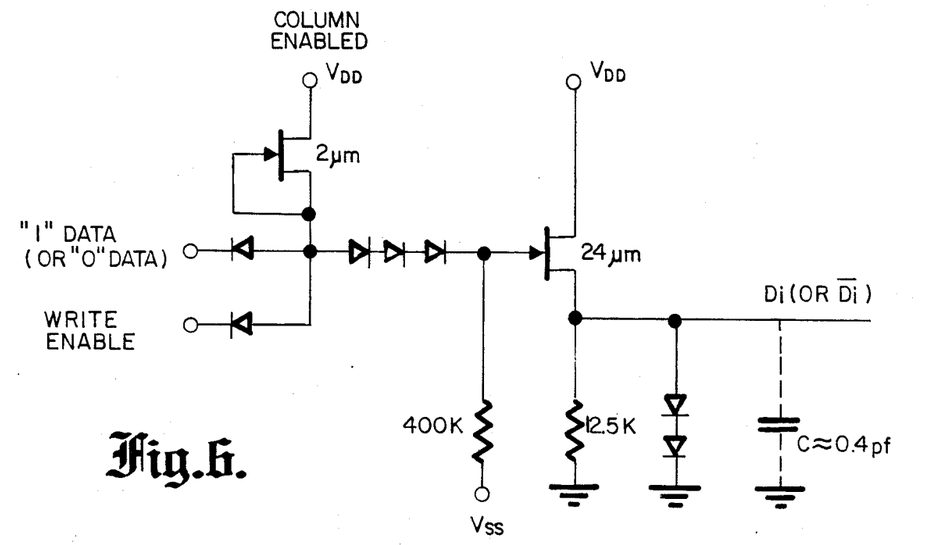
FIG. 6 is a schematic of a write circuit for the FIG. 2 arrangement.

The write circuits 64 and 66 of FIG. 2, one of which is shown in more detail in the schematic of FIG. 6, are designed to raise the voltage of a write "1" or write "0" line to 1.5 V in 1 ns, hold it at 1 V for 1 ns, and then allow the line to discharge in 5 ns.

Figure 7:
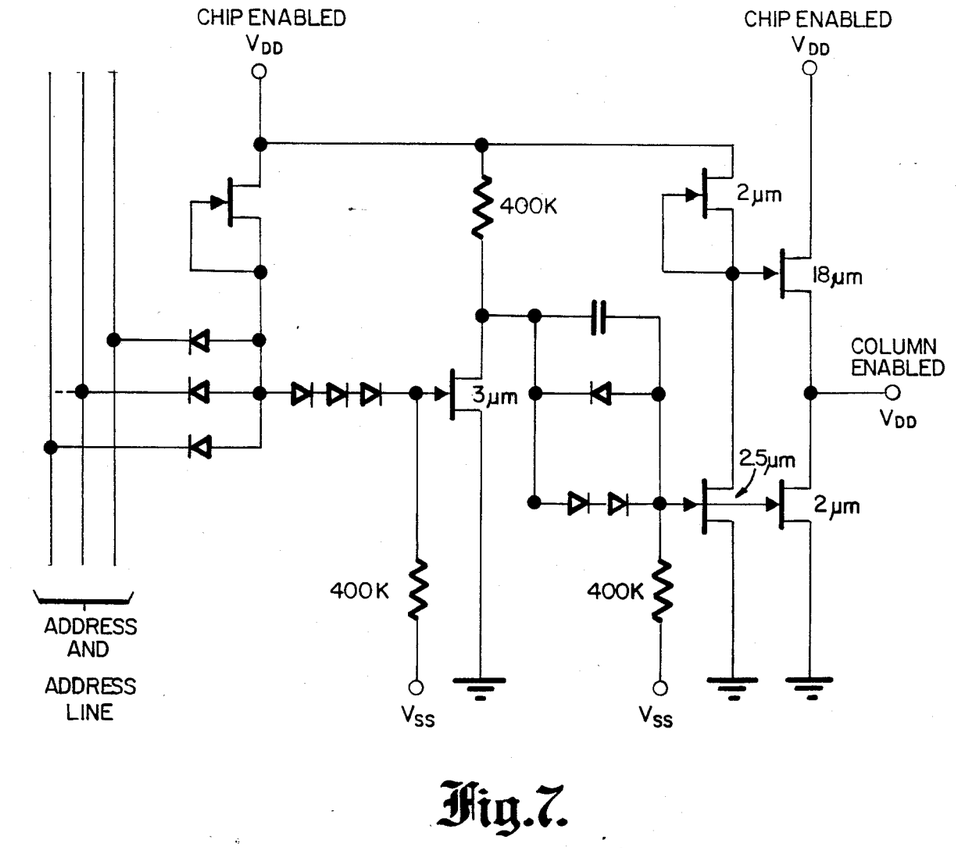
FIG. 7 is a schematic of a column decoder circuit for the array of FIG. 2.

The column decoder circuit 58, shown in schematic form in FIG. 7, is essentially a power gate for Vdd to its associated column circuits. The output stage is a complementary driver, similar to the "super buffer" circuit used in MOS designs. The circuit is designed for an output voltage rise time of 1 ns. Resistive pulldowns contribute to a very low power dissipation when disabled.

Figure 8:
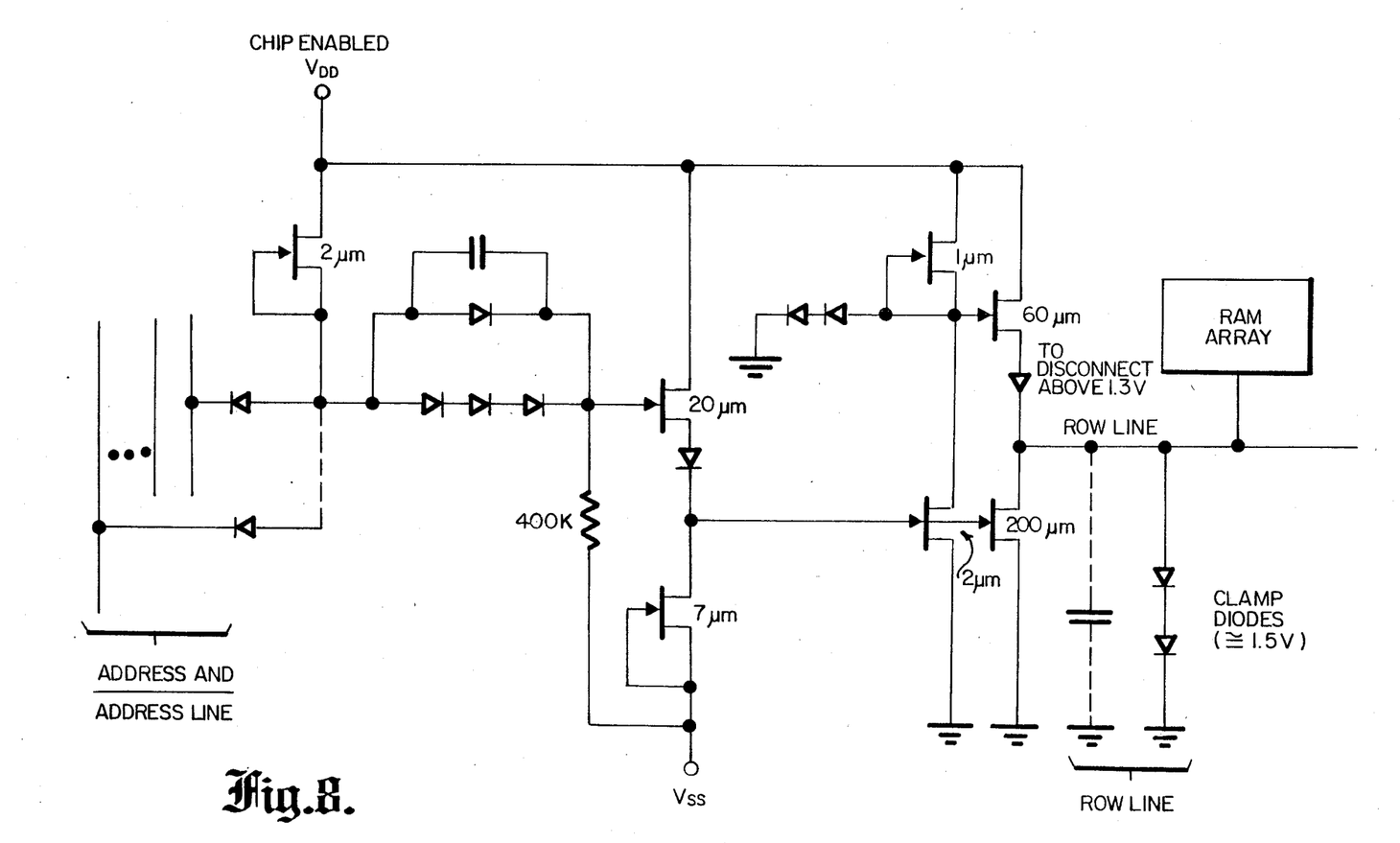
FIG. 8 is a schematic of a row decoder circuit for the FIG. 2 array.

The row decoder circuit 56, which is depicted in schematic form in FIG. 8, is required to lower the selected row line voltage to 0 V, while maintaining unselected rows at ±1.5 V. It is designed to minimize power when deselected, since at any time the chip is enabled, all but one of the rows are deselected. The circuit also minimizes power when disabled.

Figure 9:
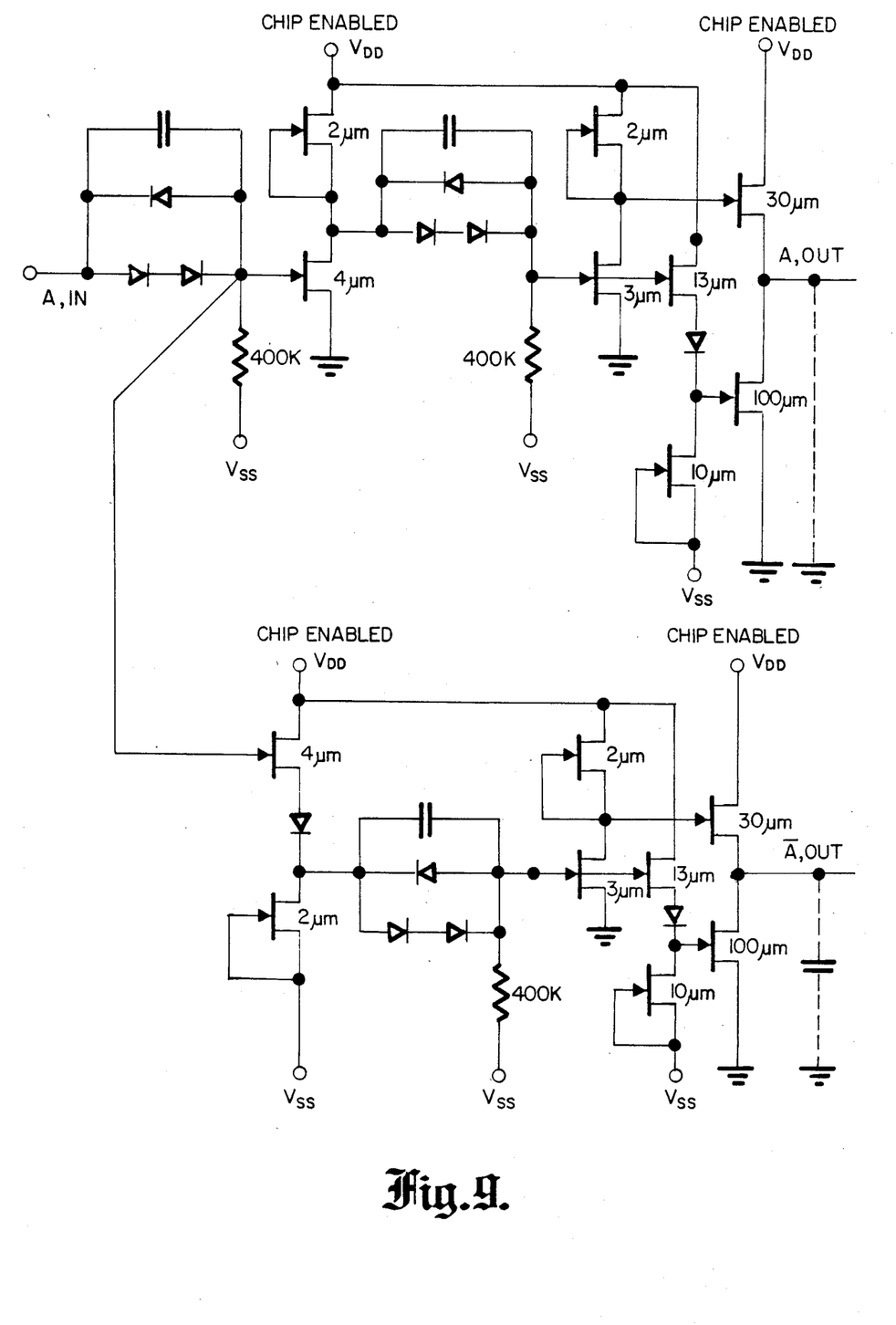
FIG. 9 is a schematic of an address circuit for FIG. 2.

Both the row and column decoders depend on having the true and complement of each address bit available. The address line drivers form the complements, and provide line driver capability for true and complement. An address circuit is shown in schematic form in FIG. 9. The same circuit is used both for the row (6 bits) and column (6 bits) addresses, for a total of 12 bits.

Figure 10:
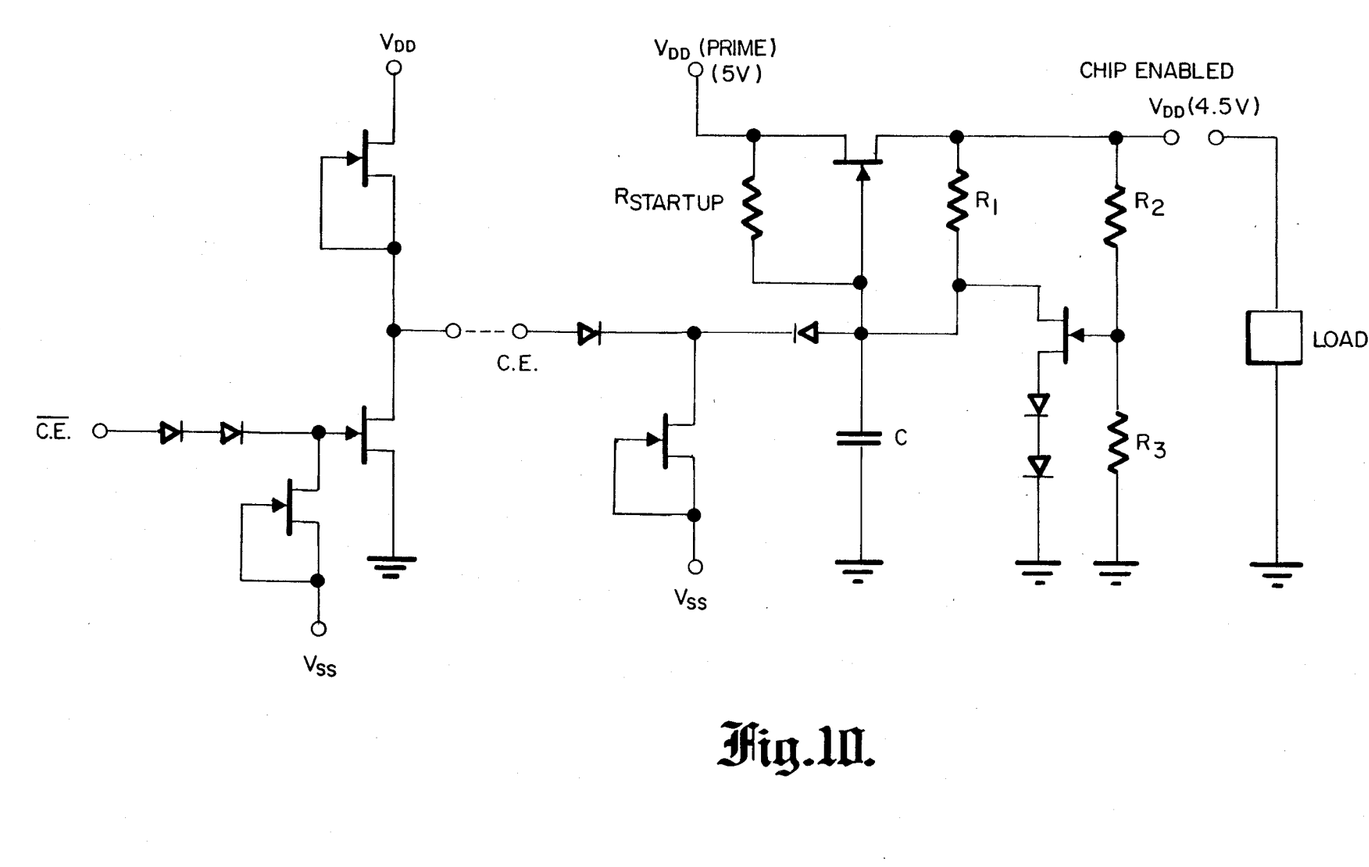
FIG. 10 is a schematic of a power switch for FIG. 2.

The power switch 54, shown in more detail in the schematic of FIG. 10, is essentially a regulator which can be switched on and off by a chip enable signal. Including this circuit on chip allows the chip enable line to be only a logic signal, but introduces additional power dissipation of approximately 2 mw in the disabled state. It can be left off the chip if the chip enable function is performed by switching a power supply line.

The chip power dissipation was calculated for this 4K RAM design. With the chip peripheral circuits disabled, the estimated power dissipation is 3.73 mW for the array and 0.7 mW for the disabled decoder circuits, for a total chip dissipation of 5.73 mW. With the chip peripheral circuits enabled, and one row and one column addressed, the chip power is increased to 112 mW or to 115 mW if dynamic power (read or write) is included. Thus the operating power is approximately 20 times the standby power. Consequently, operational duty cycles of 1/20=5% represent the point where the operating power rather than standby power will determine the overall power dissipation. Duty cycles are expected to be lower than this, however, under operational conditions.

In conclusion, although one particular embodiment of the invention has been described, modifications and additional embodiments will undoubtedly be apparent to those skilled in the art. In general, equivalent elements may be substituted for those described herein, parts might be interchanged, connections might be reversed, and certain features of the invention might be used independently of other features. Consequently, the particular example which has been presented should be considered as illustrative only and not inclusive, the appended claims being more indicative of the full scope of the invention.

We claim:

1. A random access memory circuit for use in conjunction with a positive supply voltage, a negative supply voltage, a read enable line, an output line, a write "1" line, and a write "0" line, comprising:
   a first level shifting diode, the anode of which is coupled to said positive supply voltage;
   a second level shifting diode, the anode of which is connected to the cathode of said first level shifting diode and the cathode of which is coupled to said negative supply voltage;
   a third level shifting diode, the anode of which is coupled to said positive supply voltage;
   a fourth level shifting diode, the anode of which is connected to the cathode of said third level shifting diode and the cathode of which is coupled to said negative supply voltage;
   a first input isolation diode, the anode of which is connected to said write "1" line and the cathode of which is connected to the cathode of said first level shifting diode;
   a second input isolation diode, the anode of which is connected to said write "0" line and the cathode of which is connected to the cathode of said third level shifting diode;
   a first write field effect transistor, the drain of which is connected to the anode of said third level shifting diode, the source of which is connected to said read enable line, and the gate of which is connected to the cathode of said second level shifting diode;
   a second write field effect transistor, the drain of which is connected to the anode of said first level shifting diode, the source of which is connected to said read enable line, and the gate of which is connected to the cathode of said fourth level shifting diode;
   an output buffer field effect transistor, the source of which is connected to said read enable line and the gate of which is connected to the cathode of said fourth level shifting diode; and
   an output isolation diode, the cathode of which is connected to the drain of said output buffer transistor and the anode of which is connected to said output line.

2. The circuit of claim 1, further comprising:
   a first pullup resistor connected between said positive supply voltage and the drain of said first write transistor; and
   a second pullup resistor connected between said positive supply voltage and the drain of said second write transistor.

3. The circuit of claim 2, further comprising:
   a first pulldown resistor connected between the cathode of said second level shifting diode and said negative supply voltage; and
   a second pulldown resistor connected between the cathode of said fourth level shifting diode and said negative supply voltage.

4. The circuit of claim 3, further comprising:
   a first capacitive diode, the cathode of which is connected to the anode of said first level shifting diode and the anode of which is connected to the cathode of said second level shifting diode; and
   a second capacitive diode, the cathode of which is connected to the anode of said third level shifting diode and the anode of which is connected to the cathode of said fourth level shifting diode.

5. The circuit of claim 4, wherein said circuit is fabricated on a semi-insulating GaAs substrate.

6. The circuit of claim 5, wherein said field effect transistors further comprise depletion mode metal semiconductor field effect transistors.

7. The circuit of claim 6, wherein said diodes further comprise Schottky barrier diodes.

8. A random access memory circuit for use in conjunction with a positive supply voltage, a negative supply voltage, a read enable line, an output line, a write "1" line, and a write "0" line, comprising:
   a first level shifting diode;
   a second level shifting diode, the anode of which is connected to the cathode of said first level shifting diode;
   a third level shifting diode;
   a fourth level shifting diode, the anode of which is connected to the cathode of said third level shifting diode;
   a first pullup resistor connected between said positive supply voltage and the anode of said third level shifting diode;
   a second pullup resistor connected between said positive supply voltage and the anode of said first level shifting diode;
   a first pulldown resistor connected between said negative supply voltage and the cathode of said second level shifting diode;
   a second pulldown resistor connected between negative supply voltage and the cathode of said fourth level shifting diode;
   a first input isolation diode, the anode of which is connected to said write "1" line and the cathode of which is connected to the cathode of said first level shifting diode;
   a second input isolation diode, the anode of which is connected to said write "0" line and the cathode of which is connected to the cathode of said third level shifting diode;

a first write field effect transistor, the drain of which is connected to the anode of said third level shifting diode, the source of which is connected to said read enable line, and the gate of which is connected to the cathode of said second level shifting diode;

a second write field effect transistor, the drain of which is connected to the anode of said first level shifting diode, the source of which is connected to said read enable line, and the gate of which is connected to the cathode of said fourth level shifting diode;

an output buffer field effect transistor, the source of which is connected to said read enable line and the gate of which is connected to the cathode of said fourth level shifting diode;

an output isolation diode, the cathode of which is connected to the drain of said output buffer transistor and the anode of which is connected to said output line;

a first capacitive diode, the cathode of which is connected to the anode of said first level shifting diode and the anode of which is connected to the cathode of said second level shifting diode; and a second capacitive diode, the cathode of which is connected to the anode of said third level shifting diode and the anode of which is connected to the cathode of said fourth level shifting diode.

9. An m×n random access memory circuit for use in conjunction with a positive supply voltage, a negative supply voltage, m read enable lines, n output lines, n write "1" lines, and n write "0" lines, each memory circuit in the array comprising:

a first level shifting diode, the anode of which is coupled to said positive supply voltage;

a second level shifting diode, the anode of which is connected to the cathode of said first level shifting diode and the cathode of which is coupled to said negative supply voltage;

a third level shifting diode, the anode of which is coupled to said positive supply voltage;

a fourth level shifting diode, the anode of which is connected to the cathode of said third level shifting diode and the cathode of which is coupled to said negative supply voltage;

a first input isolation diode, the anode of which is connected to said write "1" line and the cathode of which is connected to the cathode of said first level shifting diode;

a second input isolation diode, the anode of which is connected to said write "0" line and the cathode of which is connected to the cathode of said third level shifting diode;

a first write field effect transistor, the drain of which is connected to the anode of said third level shifting diode, the source of which is connected to said read enable line, and the gate of which is connected to the cathode of said second level shifting diode;

a second write field effect transistor, the drain of which is connected to the anode of said first level shifting diode, the source of which is connected to said read enable line, and the gate of which is connected to the cathode of said fourth level shifting diode;

an output buffer field effect transistor, the source of which is connected to said read enable line and the gate of which is connected to the cathode of said fourth level shifting diode; and an output isolation diode, the cathode of which is connected to the drain of said output buffer transistor and the anode of which is connected to said output line.

10. The circuit of claim 9, further comprising:

a first pullup resistor connected between said positive supply voltage and the drain of said first write transistor; and a second pullup resistor connected between said positive supply voltage and the drain of said second write transistor.

11. The circuit of claim 10, further comprising:

a first pulldown resistor connected between the cathode of said second level shifting diode and said negative supply voltage; and a second pulldown resistor connected between the cathode of said fourth level shifting diode and said negative supply voltage.

12. The circuit of claim 11, further comprising:

a first capacitive diode, the cathode of which is connected to the anode of said first level shifting diode and the anode of which is connected to the cathode of said second level shifting diode; and a second capacitive diode, the cathode of which is connected to the anode of said third level shifting diode and the anode of which is connected to the cathode of said fourth level shifting diode.

13. The circuit of claim 12, wherein said circuit is fabricated on a semi-insulating GaAs substrate.

14. The circuit of claim 13, wherein said field effect transistors further comprise depletion mode metal semiconductor field effect transistors.

15. The circuit of claim 14, wherein said diodes further comprise Schottky barrier diodes.

16. An m×n random access memory circuit for use in conjunction with a positive supply voltage, a negative supply voltage, m read enable lines, n output lines, n write "1" lines, and n write "0" lines, comprising:

a first level shifting diode;

a second level shifting diode, the anode of which is connected to the cathode of said first level shifting diode;

a third level shifting diode;

a fourth level shifting diode, the anode of which is connected to the cathode of said third level shifting diode;

a first pullup resistor connected between said positive supply voltage and the anode of said third level shifting diode;

a second pullup resistor connected between said positive supply voltage and the anode of said first level shifting diode;

a first pulldown resistor connected between said negative supply voltage and the cathode of said second level shifting diode;

a second pulldown resistor connected between said negative supply voltage and the cathode of said fourth level shifting diode;

a first input isolation diode, the anode of which is connected to said write "1" line and the cathode of which is connected to the cathode of said first level shifting diode;

a second input isolation diode, the anode of which is connected to said write "0" line and the cathode of which is connected to the cathode of said third level shifting diode;

a first write field effect transistor, the drain of which is connected to the anode of said third level shifting diode, the source of which is connected to said read enable line, and the gate of which is connected to the cathode of said second level shifting diode;

a second write field effect transistor, the drain of which is connected to the anode of said first level shifting diode, the source of which is connected to said read enable line, and the gate of which is connected to the cathode of said fourth level shifting diode;

an output buffer field effect transistor, the source of which is connected to said read enable line and the gate of which is connected to the cathode of said fourth level shifting diode;

an output isolation diode, the cathode of which is connected to the drain of said output buffer transistor and the anode of which is connected to said output line;

a first capacitive diode, the cathode of which is connected to the anode of said first level shifting diode and the anode of which is connected to the cathode of said second level shifting diode; and a second capacitive diode, the cathode of which is connected to the anode of said third level shifting diode and the anode of which is connected to the cathode of said fourth level shifting diode.

* * * * *